United States Patent
Zhu et al.

(10) Patent No.: US 11,674,076 B2
(45) Date of Patent: Jun. 13, 2023

(54) DIELECTRIC ELASTOMER PRECURSOR FLUID, PREPARATION METHOD THEREFOR AND USE THEREOF, DIELECTRIC ELASTOMER COMPOSITE MATERIAL, FLEXIBLE DEVICE, AND LIGHT-EMITTING DEVICE

(71) Applicant: THE CHINESE UNIVERSITY OF HONG KONG, SHENZHEN, Guangdong (CN)

(72) Inventors: Shiping Zhu, Guangdong (CN); Changgeng Zhang, Guangdong (CN); Lei Shi, Guangdong (CN); Qi Zhang, Guangdong (CN)

(73) Assignee: THE CHINESE UNIVERSITY OF HONG KONG, SHENZHEN, Guangdong (CN)

( * ) Notice: Subject to any disclaimer, the term of this patent is extended or adjusted under 35 U.S.C. 154(b) by 0 days.

(21) Appl. No.: 17/799,881

(22) PCT Filed: Jun. 24, 2020

(86) PCT No.: PCT/CN2020/098129
§ 371 (c)(1),
(2) Date: Aug. 15, 2022

(87) PCT Pub. No.: WO2021/179477
PCT Pub. Date: Sep. 16, 2021

(65) Prior Publication Data
US 2023/0090617 A1    Mar. 23, 2023

(30) Foreign Application Priority Data

Mar. 10, 2020 (CN) .......................... 202010163954.X

(51) Int. Cl.
| | | |
|---|---|---|
| *C09K 11/02* | (2006.01) | |
| *C08G 77/04* | (2006.01) | |
| *H01L 33/26* | (2010.01) | |
| *C09K 11/58* | (2006.01) | |
| *H01L 33/00* | (2010.01) | |
| *H01L 33/28* | (2010.01) | |

(52) U.S. Cl.
CPC .............. *C09K 11/02* (2013.01); *C08G 77/04* (2013.01); *C09K 11/584* (2013.01); *H01L 33/26* (2013.01); *H01L 33/0083* (2013.01); *H01L 33/285* (2013.01)

(58) Field of Classification Search
CPC .................... C09K 11/02; C08G 77/04–80
See application file for complete search history.

(56) References Cited

U.S. PATENT DOCUMENTS

2013/0292167 A1   11/2013   Schmid et al.
2015/0129808 A1   5/2015    Mrozek et al.

FOREIGN PATENT DOCUMENTS

| CN | 104861183 A | 8/2015 |
| CN | 105140350 A | 12/2015 |
| CN | 108440891 A | 8/2018 |
| CN | 108504041 A | 9/2018 |
| CN | 109929074 A | 6/2019 |
| CN | 110272559 A | 9/2019 |
| CN | 111205406 A | 5/2020 |

OTHER PUBLICATIONS

The First Office Action for Chinese Patent Application No. 202010163954.X issued by the Chinese Patent Office dated Aug. 28, 2020.
The Second Office Action for Chinese Patent Application No. 202010163954.X issued by the Chinese Patent Office dated Nov. 3, 2020.
The First Search of Priority Document for Chinese Patent Application No. 202010163954.X issued by the Chinese Patent Office.
Supplementary Search of Priority document for Chinese Patent Application No. 202010163954.X issued by the Chinese Patent Office.
Notification to Grant Patent Right for Chinese Patent Application No. 202010163954.X issued by the Chinese Patent Office dated Dec. 10, 2020.
International Search Report for International Application No. PCT/CN2020/098129 issued by the Chinese Patent Office dated Nov. 18, 2020.
Written Opinion of the International Search Authority for International Application No. PCT/CN2020/098129 issued by the Chinese Patent Office dated Nov. 18, 2020.

*Primary Examiner* — Matthew E. Hoban
(74) *Attorney, Agent, or Firm* — IP & T Group LLP

(57) ABSTRACT

The present disclosure relates to the field of dielectric elastomers. In particular, provided are a dielectric elastomer precursor fluid, a preparation method therefor and the use thereof, a dielectric elastomer composite material, a flexible device, and a light-emitting device. The dielectric elastomer precursor fluid comprises an elastomer matrix, an ionic liquid and a solvent, wherein the volume fraction of the ionic liquid and the solvent is 5-45%. The dielectric elastomer precursor fluid has the advantages of a high conductivity, a high transparency and a good fluidity, and is beneficial for preparing a dielectric elastomer composite material having a high dielectric constant, a low elastic modulus and a high optical transparency, thus fully solving the problem that a high dielectric constant cannot be balanced with a low elastic modulus and a high optical transparency in a dielectric elastomer.

15 Claims, No Drawings

DIELECTRIC ELASTOMER PRECURSOR FLUID, PREPARATION METHOD THEREFOR AND USE THEREOF, DIELECTRIC ELASTOMER COMPOSITE MATERIAL, FLEXIBLE DEVICE, AND LIGHT-EMITTING DEVICE

CROSS-REFERENCE TO RELATED APPLICATION

This application is a National Phase application of PCT application no. PCT/CN2020/098129 filed on Jun. 24, 2020, which claims the priority to the Chinese patent application with the filing number CN202010163954.X, filed on Mar. 10, 2020 with the Chinese Patent Office, and entitled "Dielectric Elastomer Precursor Fluid, Preparation Method Therefor and Use Thereof, Dielectric Elastomer Composite Material, Flexible Device, and Light-emitting Device", the contents of which are incorporated herein by reference in entirety.

TECHNICAL FIELD

The present disclosure relates to the field of dielectric elastomers, and in particular, to a dielectric elastomer precursor fluid, a preparation method therefor and use thereof, a dielectric elastomer composite material, a flexible device, and a light-emitting device.

BACKGROUND ART

Dielectric elastomers are a new class of smart materials that not only have the ability to be deformed under the action of an electric field, but also can convert mechanical energy into electrical signals or electrical energy. Therefore, dielectric elastomer materials can be used in the manufacture of flexible actuators. Compared with traditional devices, dielectric elastomer-based actuators have the characteristics such as good flexibility, low density, and large strain, so they have wide application potential in the fields such as flexible electronics, bionic robots, and haptic devices.

The working mechanism of dielectric elastomer actuator has been widely studied. A typical dielectric elastomer actuator consists of two flexible electrodes and a dielectric elastomer film sandwiched therebetween, a high electric field is applied, and the dielectric elastomer actuator is deformed by Maxwell stress, resulting in compression in a thickness direction and expansion in a plane direction perpendicular to the thickness direction. Obviously, a low modulus, a high electric field, and a high dielectric constant can endow the elastomer with a larger driving strain. However, commonly used dielectric elastomers, such as organosilicone, acrylic acid and polyurethane, have lower relative dielectric constants, only 2-8.6. Therefore, the research at home and abroad mainly focuses on the preparation of dielectric elastomer composite materials, increasing the dielectric constant and reducing the driving voltage.

The commonly used method to improve the dielectric constant of composite materials is to add fillers to the elastomer matrix, such as inorganic fillers with high dielectric constant (such as $TiO_2$, $BaTiO_3$), lead niobate-lead titanate (PMNePT) and conductive fillers (such as liquid metal, silver particles, structured carbon black, carbon nanotubes, graphene sheets, reduced graphene oxide). Although adding the above functional fillers can effectively increase the dielectric constant of the composite materials, simultaneously, the elastic modulus of the composite materials will be greatly increased, and accompanied by higher dielectric loss and lower breakdown voltage. Therefore, the preparation of dielectric elastomer composite material with a high dielectric constant and a low elastic modulus will greatly broaden application scenarios thereof.

SUMMARY

The present disclosure provides a dielectric elastomer precursor fluid, the precursor fluid has the advantages of a high conductivity, a high transparency and a good fluidity, and is beneficial for preparing a dielectric elastomer composite material having a high dielectric constant, a low elastic modulus and a high optical transparency.

The present disclosure provides a preparation method of the above-mentioned dielectric elastomer precursor liquid.

The present disclosure provides a dielectric elastomer composite material, the composite material has the advantages of a high dielectric constant, a low elastic modulus, and a high optical transparency.

The present disclosure provides a preparation method of the above-mentioned dielectric elastomer composite material.

The present disclosure provides use of the above-mentioned dielectric elastomer composite material in the preparation of a flexible device.

The present disclosure provides a flexible device.

The present disclosure provides a light-emitting device.

The present disclosure provides a preparation method of the above-mentioned light-emitting device.

The present disclosure provides a dielectric elastomer precursor fluid, which comprises an elastomer matrix, an ionic liquid and a solvent, wherein the volume fraction of the ionic liquid and the solvent is 5%-45%.

In one or more embodiments, the volume fraction of the ionic liquid and the solvent is 10%-40%, more preferably 15%-40%.

In one or more embodiments, the volume ratio of ionic liquid to solvent is (9-1):1, more preferably (3-1):1.

In one or more embodiments, the droplet diameter of the liquid mixture of the ionic liquid and the solvent is 2-10 microns, more preferably 2-5 microns.

In one or more embodiments, the elastomeric matrix comprises a thermoset elastomer or a thermoplastic elastomer.

In one or more embodiments, the thermoset elastomer comprises a silicone rubber.

In one or more embodiments, the silicone rubber comprises polydimethylsiloxane.

In one or more embodiments, the thermoplastic elastomer comprises polyacrylate.

In one or more embodiments, the polyacrylate comprises polyethyl acrylate.

In one or more embodiments, the ionic liquid comprises at least one of 1-Propyl-3-Methylimidazolium bis(trifluoromethylsulfonyl)imide, 1-ethyl-3-methylimidazolium hexafluorophosphate or 1-ethyl-3-methylimidazolium bis(trifluoromethylsulfonyl)imide.

In one or more embodiments, the solvent comprises tributyl citrate and/or fluoroethylene carbonate.

In one or more embodiments, a difference value between a refractive index of the elastomer matrix and a refractive index of the liquid mixture of the ionic liquid and the solvent is 0-0.001, further preferably, the refractive index of the elastomer matrix is the same as the refractive index of the liquid mixture of the ionic liquid and the solvent.

In one or more embodiments, the dielectric elastomer precursor liquid further comprises a crosslinking agent.

In one or more embodiments, the ionic liquid is an imidazolium ionic liquid.

In one or more embodiments, the ionic liquid is an ionic liquid composed of imidazolium cations and imide anions and/or an ionic liquid composed of imidazolium cations and hexafluorophosphate anions.

In one or more embodiments, the solvent is at least one selected from the group consisting of citrate and fluorocarbonate.

The present disclosure also provides a preparation method of the above-mentioned dielectric elastomer precursor liquid, wherein the method comprises: uniformly mixing raw materials to obtain the dielectric elastomer precursor liquid.

The present disclosure also provides a dielectric elastomer composite material, which is prepared from the above-mentioned dielectric elastomer precursor liquid.

The present disclosure provides a preparation method of the above-mentioned dielectric elastomer composite material, wherein the method comprises: curing the above-mentioned dielectric elastomer precursor liquid, so as to obtain the dielectric elastomer composite material.

In one or more embodiments, a curing method comprises a thermal curing and/or a photo-curing.

In one or more embodiments, a thermal curing condition comprises at least one of the following conditions: a curing temperature is 60-80° C., or a curing time is 2-24 h.

In one or more embodiments, a photo-curing condition comprises at least one of the following conditions: a curing light source comprises an ultraviolet light, a curing power density is 45-55 mW/cm$^2$, or a curing time is 20-40 min.

The present disclosure provides use of the above-mentioned dielectric elastomer composite material or the dielectric elastomer composite material obtained by the above-mentioned method in a preparation of a flexible device.

In one or more embodiments, the flexible device comprises an actuator, a sensor, a display or a robot.

In one or more embodiments, the present disclosure provides a flexible device, which comprises the above-mentioned dielectric elastomer composite material or the dielectric elastomer composite material obtained by the above-mentioned method.

In one or more embodiments, the flexible device comprises the actuator, the sensor, the display or the robot.

The present disclosure provides a light-emitting device, which is mainly prepared from the above-mentioned dielectric elastomer precursor liquid, a light-emitting material and an electrode.

In one or more embodiments, the mass ratio of the dielectric elastomer precursor liquid and the light-emitting material is (0.4-2):1, more preferably (0.5-1):1;

In one or more embodiments, the particle diameter of the light-emitting material is larger than the diameter of the ionic liquid droplet.

In one or more embodiments, the particle diameter of the light-emitting material is 9-30 microns.

The present disclosure also provides a preparation method of the above-mentioned light-emitting device, which comprises: mixing the dielectric elastomer precursor liquid and the light-emitting material uniformly and then curing, and then compounding with the electrode to obtain the light-emitting device.

In one or more embodiments, the method further comprises steps of: uniformly mixing the dielectric elastomer precursor liquid and the light-emitting material to obtain a light-emitting layer precursor liquid, and then controlling a thickness of the light-emitting layer precursor liquid to be 100-500 microns, and then curing the same.

In one or more embodiments, a curing method comprises a thermal curing and/or a photo-curing.

In one or more embodiments, a thermal curing condition comprises at least one of the following conditions: a curing temperature is 60-80° C., or a curing time is 2-24 h.

In one or more embodiments, a photo-curing condition comprises at least one of the following conditions: a curing light source comprises an ultraviolet light, a curing power density is 45-55 mW/cm$^2$, or a curing time is 20-40 min.

In one or more embodiments, the light-emitting material comprises an electroluminescent material.

In one or more embodiments, the electroluminescent material is at least one selected from the group consisting of ZnS:Cu, ZnS:Al and ZnS:Mn.

In one or more embodiments, the electrode is a silicone rubber electrode coated with silver nanowire/monolayer graphene or an ion gel electrode.

The present disclosure also provides a use of the dielectric elastomer precursor liquid described herein for preparing a flexible device.

The present disclosure also provides a use of the dielectric elastomer precursor liquid described herein for preparing a light-emitting device.

Compared with the prior art, the beneficial effects of the present disclosure at least include the following.

The dielectric elastomer precursor liquid provided in the present disclosure comprises an elastomer matrix and a specific volume fraction of an ionic liquid and a solvent, wherein the combination of the ionic liquid and the solvent can improve the degree of dissociation of the ionic liquid, thereby obtaining a ionic liquid mixture with a higher conductivity, therefore, the obtained dielectric elastomer precursor liquid can improve the dielectric constant of the composite material prepared by using the precursor liquid. Due to the good fluidity of the liquid mixture, the obtained dielectric elastomer precursor liquid can significantly reduce the elastic modulus of the composite material, thereby fully solving the problem that a high dielectric constant cannot be balanced with a low elastic modulus in a dielectric elastomer. In addition, due to the higher transparency of the liquid mixture itself, the obtained dielectric elastomer precursor liquid has a higher optical transparency, thereby improving the optical transparency of the composite material, and solving the problem that the high dielectric constant cannot be balanced with the high optical transparency in the dielectric elastomer.

The volume fraction of ionic liquid and solvent should not be too low or too high. If it is too low, then the obtained precursor liquid will make the composite material have a higher elastic modulus and a lower dielectric constant; and if it is too high, then the transparency will be poorer. When the volume fraction of the two is between 5% and 45%, the optical transparency, fluidity and conductivity of the dielectric elastomer precursor liquid are all higher, which is beneficial to improve the dielectric constant, elastic modulus (better elasticity) and transparency of the composite material, thereby improving the overall performance of the composite material.

The dielectric elastomer composite material provided by the present disclosure is prepared by using the above-mentioned dielectric elastomer precursor liquid, and thus has a higher dielectric constant, a lower elastic modulus and a higher optical transparency.

In the light-emitting device provided by the present disclosure, the dielectric elastomer precursor liquid is combined with the light-emitting material. Since the dielectric elastomer precursor liquid has a higher conductivity, the dielectric constant of the light-emitting layer of the light-emitting device can be improved, so the intensity of the electric field focused on the light-emitting layer increases, and because the dielectric elastomer precursor liquid has a higher optical transparency, the light emitted by the light-emitting material will not be lost during the propagation process, therefore, the driving voltage of the obtained light-emitting device is lower. In addition, since the above-mentioned dielectric elastomer precursor liquid has a good fluidity, the obtained light-emitting device has a low elastic modulus and a good stretchability.

DETAILED DESCRIPTION OF EMBODIMENTS

The implementation plan of the present disclosure will be described in detail below with reference to the embodiments, but those skilled in the art will understand that the following embodiments are only used to illustrate the present disclosure and should not be regarded as limiting the scope of the present disclosure. If the specific conditions are not indicated in the embodiments, it is carried out according to the conventional conditions or the conditions suggested by the manufacturer.

According to one aspect of the present disclosure, a dielectric elastomer precursor liquid is provided in at least one embodiment, the dielectric elastomer precursor liquid comprises an elastomer matrix, an ionic liquid and a solvent, and the volume fraction of the ionic liquid and the solvent is 5%-45%.

As used herein, the term "ionic liquid" generally refers to a salt in liquid form below 100° C., for example, at room temperature (typically about 20° C. to 25° C.). Typically, the ionic liquid has a melting point of about 40° C. or less. In the ionic liquids, some may have nitrogen-containing aromatic moieties as cationic components, such as imidazolium moieties; and the anion moieties in the ionic liquids comprise, for example, an imide anion or a phosphate anion.

The above-mentioned dielectric elastomer precursor liquid comprises an elastomer matrix and a specific volume fraction of an ionic liquid and a solvent, wherein the combination of the ionic liquid and the solvent can improve the degree of dissociation of the ionic liquid, thereby obtaining a ionic liquid mixture with a higher conductivity, therefore, the obtained dielectric elastomer precursor liquid can improve the dielectric constant of the composite material prepared by using the precursor liquid. Due to the good fluidity of the liquid mixture, the obtained dielectric elastomer precursor liquid can significantly reduce the elastic modulus of the composite material, thereby fully solving the problem that a high dielectric constant cannot be balanced with a low elastic modulus in a dielectric elastomer. In addition, due to the higher transparency of the liquid mixture itself, the obtained dielectric elastomer precursor liquid has a higher optical transparency, thereby improving the optical transparency of the composite material, and solving the problem that the high dielectric constant cannot be balanced with the high optical transparency in the dielectric elastomer.

The volume fraction of the above-mentioned ionic liquid and solvent comprises, for example, 5%, 6%, 7%, 8%, 9%, 10%, 11%, 12%, 13%, 14%, 15%, 16%, 17%, 18%, 19%, 20%, 21%, 22%, 23%, 24%, 25%, 26%, 27%, 28%, 29%, 30%, 31%, 32%, 33%, 34%, 35%, 36%, 37%, 38%, 39%, 40%, 41%, 42%, 43%, 44% or 45%. As used herein, the term "volume fraction" refers to the percentage of the sum of volumes of both ionic liquid and solvent to the total volume of all raw materials. The volume fraction of ionic liquid and solvent should not be too low or too high. If it is too low, then the obtained precursor liquid will make the composite material have a higher elastic modulus and a lower dielectric constant; and if it is too high, then the transparency will be poorer. When the volume fraction of the two is between 5% and 45%, the optical transparency, fluidity and conductivity of the dielectric elastomer precursor liquid are all higher, which is beneficial to improve the dielectric constant, elastic modulus (better elasticity) and transparency of the composite material, thereby improving the overall performance of the composite material.

As used herein, the term "elastomer matrix" refers to a polymer material that can quickly return to a state and size near the original state and size after being stretched or pressurized, with the disappearance of external forces.

In one or more embodiments, the volume fraction of ionic liquid and solvent is 10%-40%, for example, 15%-40%. The volume fraction of ionic liquid and solvent within this range can make the composite material have better overall performance including dielectric constant, elastic modulus and transparency.

In one or more embodiments, the volume ratio of ionic liquid and solvent is (9-1):1, for example, (3-1):1. The above-mentioned volume ratio comprises, for example, 9:1, 8.5:1, 8:1, 7.5:1, 7:1, 6.5:1, 6:1, 5.5:1, 5:1, 4.5:1, 4:1, 3.5:1, 3:1, 2.5:1, 2:1, 1.5:1, or 1:1. The above-mentioned volume ratio should not be too high or too low, if it is too high, then the fluidity of the mixed liquid will be poor, it will not be easily miscible with the elastomer matrix, and the transparency will be poorer; and if it is too low, then the conductivity of the mixed liquid will be poor, and the dielectric properties of the elastomer cannot be improved. When the volume ratio is within the above range, the fluidity, optical transparency and conductivity of the mixed liquid are all better, and it is not easy to dissolve with the elastomer matrix.

In one or more embodiments, the droplet diameter of the liquid mixture of the ionic liquid and the solvent is 2-10 microns, for example, 2-5 microns. Above-mentioned droplet diameter includes, for example, 2, 2.5, 3, 3.5, 4, 4.5, 5, 5.5, 6, 6.5, 7, 7.5, 8, 8.5, 9, 9.5, or 10 microns. As used herein, the term "droplet diameter" refers to the diameter of a droplet as measured using optical microscopy or laser confocal microscopy.

In one or more embodiments, the elastomeric matrix comprises a thermoset elastomer or a thermoplastic elastomer.

In one or more embodiments, the thermoset elastomer comprises a silicone rubber. The silicone rubber has good elasticity and heat resistance, and high transparency.

In one or more embodiments, the silicone rubber comprises polydimethylsiloxane.

In one or more embodiments, the thermoplastic elastomer comprises polyacrylate.

In one or more embodiments, the polyacrylate comprises polyethyl acrylate.

In one or more embodiments, the ionic liquid is an imidazolium ionic liquid.

In one or more embodiments, the ionic liquid is an ionic liquid composed of imidazolium cations and imide anions and/or an ionic liquid composed of imidazolium cations and hexafluorophosphate anions.

In one or more embodiments, the ionic liquid comprises at least one of 1-Propyl-3-Methylimidazolium bis(trifluoromethylsulfonyl)imide, 1-ethyl-3-methylimidazolium hexafluorophosphate or 1-ethyl-3-methylimidazolium bis (trifluoromethylsulfonyl)imide. The above ionic liquid includes but is not limited to 1-Propyl-3-Methylimidazolium bis(trifluoromethylsulfonyl)imide, 1-ethyl-3-methylimidazolium hexafluorophosphate, 1-ethyl-3-methylimidazolium bis(trifluoromethylsulfonyl)imide, a combination of 1-Propyl-3-Methylimidazolium bis(trifluoromethylsulfonyl)imide and 1-ethyl-3-methylimidazolium hexafluorophosphate, a combination of 1-ethyl-3-methylimidazolium hexafluorophosphate and 1-ethyl-3-methylimidazolium bis(trifluoromethylsulfonyl)imide, a combination of 1-Propyl-3-Methylimidazolium bis(trifluoromethylsulfonyl)imide and 1-ethyl-3-methylimidazolium bis(trifluoromethylsulfonyl)imide, or a combination of 1-Propyl-3-Methylimidazolium bis(trifluoromethylsulfonyl)imide, 1-ethyl-3-methylimidazolium hexafluorophosphate and 1-ethyl-3-methylimidazolium bis(trifluoromethylsulfonyl)imide and the like. The above-mentioned ionic liquid has higher compatibility with the elastomer matrix, which is conducive to uniform mixing of the ionic liquid and the elastomer matrix in the preparation process, improves the uniformity of the dielectric elastomer precursor liquid everywhere, and ensures performance thereof.

In one or more embodiments, the ionic liquid is at least one selected from the group consisting of 1-Propyl-3-Methylimidazolium bis(trifluoromethylsulfonyl)imide, 1-ethyl-3-methylimidazolium hexafluorophosphate and 1-ethyl-3-methylimidazolium bis(trifluoromethylsulfonyl)imide.

In one or more embodiments, the solvent is at least one selected from the group consisting of citrate and fluorocarbonate.

In one or more embodiments, the solvent comprises tributyl citrate and/or fluoroethylene carbonate. Tributyl citrate and fluoroethylene carbonate have higher compatibility with ionic liquid, which can enable the solvent and the ionic liquid to be fully and uniformly mixed, and further improve the degree of dissociation of the ionic liquid, thereby further increasing the conductivity of the liquid mixture and the dielectric elastomer precursor liquid, and increasing the dielectric constant of the composite material.

In one or more embodiments, the ionic liquid is miscible with the solvent.

In one or more embodiments, the refractive index of the elastomer matrix is substantially the same as the refractive index of the liquid mixture of the ionic liquid and the solvent. In one or more embodiments, a difference value between a refractive index of the elastomer matrix and a refractive index of the liquid mixture of the ionic liquid and the solvent is 0-0.001. In one or more embodiments, the refractive index of the elastomer matrix is the same as the refractive index of the liquid mixture of the ionic liquid and the solvent. When the difference value between the refractive index of the elastomer matrix and the refractive index of liquid mixture is 0-0.001, especially when the two are the same, the refractive indices of the obtained dielectric elastomer precursor liquid everywhere are basically the same, which is beneficial to improve the uniformity of the internal optical performances of products such as final composite materials. The difference value between the above two can be, for example, 0, 0.0005 or 0.001.

In one or more embodiments, the dielectric elastomer precursor liquid further comprises a crosslinking agent. The addition of the crosslinking agent is beneficial to improve the curing efficiency of the precursor liquid during use.

The above crosslinking agent can be selected from common crosslinking agents in the field according to different curing methods, which is not particularly limited in the present disclosure.

According to another aspect of the present disclosure, a preparation method of the above-mentioned dielectric elastomer precursor liquid is provided, which comprises: uniformly mixing raw materials to obtain the dielectric elastomer precursor liquid. The method is simple and scientific in process, and suitable for industrial mass production, and the obtained dielectric elastomer precursor liquid has higher conductivity, fluidity and optical transparency, which is beneficial to prepare a composite material or device with a high dielectric constant, a low elastic modulus and a high optical transparency.

According to another aspect of the present disclosure, a dielectric elastomer composite material is provided, which is prepared by using the above-mentioned dielectric elastomer precursor liquid. The dielectric elastomer composite material is prepared by using the above-mentioned dielectric elastomer precursor liquid, and thus has a higher dielectric constant, a lower elastic modulus and a higher optical transparency.

According to another aspect of the present disclosure, a preparation method of the above-mentioned dielectric elastomer composite material is provided, which comprises: obtaining the dielectric elastomer composite material, after curing the above-mentioned dielectric elastomer precursor liquid. The above-mentioned preparation method has scientific technology, simple operation and broad market prospect.

In one or more embodiments, a curing method comprises a thermal curing and/or a photo-curing.

In one or more embodiments, the thermal curing condition comprises at least one of the following conditions: the curing temperature is 60-80° C., or the curing time is 2-24 h. The above-mentioned curing temperature is, for example, 60, 61, 62, 63, 64, 65, 66, 67, 68, 69, 70, 71, 72, 73, 74, 75, 76, 77, 78, 79 or 80° C., and the curing time is, for example, 2, 3, 4, 5, 6, 7, 8, 9, 10, 11, 12, 13, 14, 15, 16, 17, 18, 19, 20, 21, 22, 23 or 24 h.

In one or more embodiments, the photo-curing condition includes at least one of the following conditions: the curing light source includes an ultraviolet light, the curing power density is 45-55 mW/cm$^2$, or the curing time is 20-40 min. The above-mentioned curing power density is, for example, 45, 46, 47, 48, 49, 50, 51, 52, 53, 54 or 55 mW/cm$^2$, and the curing time is typically, for example, 20, 22, 24, 26, 28, 30, 32, 34, 36, 38 or 40 min.

According to another aspect of the present disclosure, use of the above-mentioned dielectric elastomer composite material in the preparation of a flexible device is provided. The use of the above-mentioned dielectric elastomer composite material in the preparation of the flexible device can enable the above-mentioned device to have a better flexibility, a higher dielectric constant, a lower elastic modulus and a higher optical transparency.

As used herein, the term "flexible device" refers to a device that is stretchable and bendable.

In one or more embodiments, the flexible device includes an actuator, a sensor, a display, or a robot.

According to another aspect of the present disclosure, a flexible device is provided, which comprises the above-mentioned dielectric elastomer composite material. The above-mentioned flexible device includes the above-mentioned dielectric elastomer composite material, and thus at least has a better flexibility, a higher dielectric constant, a lower elastic modulus and a higher optical transparency.

In one or more embodiments, the flexible device includes the actuator, the sensor, the display, or the robot.

According to another aspect of the present disclosure, a light-emitting device is provided, which is mainly prepared from the above-mentioned dielectric elastomer precursor liquid, a light-emitting material and an electrode. In this light-emitting device, the dielectric elastomer precursor liquid is combined with the light-emitting material. Since the dielectric elastomer precursor liquid has a higher conductivity, the dielectric constant of the light-emitting layer of the light-emitting device can be improved, so the intensity of the electric field focused on the light-emitting layer increases, and because the dielectric elastomer precursor liquid has a higher optical transparency, the light emitted by the light-emitting material will not be lost during the propagation process, therefore, the driving voltage of the obtained light-emitting device is lower. In addition, since the above-mentioned dielectric elastomer precursor liquid has a good fluidity, the obtained light-emitting device has a low elastic modulus and a good stretchability.

In one or more embodiments, the mass ratio of the dielectric elastomer precursor liquid and the light-emitting material is (0.4-2):1, for example, (0.5-1):1. The above-mentioned mass ratio is, for example, 0.4:1, 0.5:1, 0.6:1, 0.7:1, 0.8:1, 0.9:1, 1:1, 1.1:1, 1.2:1, 1.3:1, 1.4:1, 1.5:1, 1.6:1, 1.7:1, 1.8:1, 1.9:1 or 2:1. When the mass ratio of the two is within the above range, the driving voltage of the light-emitting device is lower, the stretchability is better, simultaneously, and light-emitting efficiency thereof can also be guaranteed.

In one or more embodiments, the particle diameter of the light-emitting material is larger than the diameter of the ionic liquid droplet. When the particle diameter of the light-emitting material is larger than the diameter of the ionic liquid droplet, the bias electric field around the light-emitting material particle will be higher, thereby further reducing the driving voltage. The above-mentioned "particle diameter" refers to a single particle diameter-projected diameter of the lighting-emitting material particle.

In one or more embodiments, the particle diameter of the lighting-emitting material is 9-30 microns. The above-mentioned particle diameter can be, for example, 9-30 microns, 9-20 microns, 9-25 microns, 10-20 microns, 15-30 microns, 20-30 microns, 10-15 microns or 25-30 microns and the like. The above-mentioned particle diameter can be, for example, 11 microns, 12 microns, 13 microns, 14 microns, 16 microns, 17 microns, 18 microns, 19 microns, 21 microns, 22 microns, 23 microns, 24 microns, 26 microns, 27 microns, 28 microns or 29 microns.

In one or more embodiments, the light-emitting material comprises an electroluminescent material.

In one or more embodiments, the electroluminescent material comprises ZnS:Cu, ZnS:Al or ZnS:Mn.

In one or more embodiments, the light-emitting device further comprises an electrode, and the electrode may be a transparent stretchable electrode selected from a silicone rubber coated with ion gel or silver nanowire/monolayer grapheme and the like.

According to another aspect of the present disclosure, a preparation method of the above-mentioned light-emitting device is provided, which comprises: mixing the above-mentioned dielectric elastomer precursor liquid and the light-emitting material uniformly and then curing, and then compounding with the electrode to obtain the light-emitting device. The method is scientific and reasonable in process, and the obtained light-emitting device has the advantages of low driving voltage and good stretchability.

In one or more embodiments, the method further includes steps of: mixing the dielectric elastomer precursor liquid and the light-emitting material uniformly to obtain a light-emitting layer precursor liquid, and then controlling the thickness of the light-emitting layer precursor liquid to be 100-500 microns, and then curing. The above thickness is typical but not limited to 100, 110, 120, 130, 140, 150, 160, 170, 180, 190, 200, 210, 220, 230, 240, 250, 260, 270, 280, 290, 300, 310, 320, 330, 340, 350, 360, 370, 380, 390, 400, 410, 420, 430, 440, 450, 460, 470, 480, 490 or 500 microns.

In one or more embodiments, the curing method includes a thermal curing and/or a photo-curing.

In one or more embodiments, the thermal curing condition includes at least one of the following conditions: the curing temperature is 60-80° C., or the curing time is 2-24 h. The above curing temperature is, for example, 60, 61, 62, 63, 64, 65, 66, 67, 68, 69, 70, 71, 72, 73, 74, 75, 76, 77, 78, 79 or 80° C., and the curing time is typical but not limited to 2, 3, 4, 5, 6, 7, 8, 9, 10, 11, 12, 13, 14, 15, 16, 17, 18, 19, 20, 21, 22, 23 or 24 h.

In one or more embodiments, the photo-curing condition includes at least one of the following conditions: the curing light source includes the ultraviolet light, the curing power density is 45-55 mW/cm$^2$, or the curing time is 20-40 min. The above curing power density is, for example, 45, 46, 47, 48, 49, 50, 51, 52, 53, 54 or 55 mW/cm$^2$, and the curing time is, for example, 20, 21, 22, 23, 24, 25, 26, 27, 28, 29, 30, 31, 32, 33, 34, 35, 36, 37, 38, 39 or 40 min.

The above-mentioned method of "compounding with electrode" can be selected from those commonly used in the art, which is not specifically limited in the present disclosure, for example, the two can be combined together in a manner of sticking.

The present disclosure will be further described in detail below in combination with the examples and comparative examples.

EXAMPLE 1

A dielectric elastomer precursor liquid was mainly prepared from an elastomer matrix, an ionic liquid, a solvent and a crosslinking agent, the volume fraction of ionic liquid and solvent (percentage of the volume sum of ionic liquid and solvent in the volume of all raw materials) was 5%, the ratio of ionic liquid volume to solvent volume was 10:1, and the droplet diameter of the liquid mixture of ionic liquid and solvent was 11 microns; and the elastomer matrix was polydimethylsiloxane, and the ionic liquid was 1-Propyl-3-Methylimidazolium bis(trifluoromethylsulfonyl)imide, purchased from Lanzhou Institute of Chemical Physics, Chinese Academy of Sciences; the solvent was tributyl citrate, purchased from Sigma-Aldrich (Shanghai) Trading Co., Ltd.; and the crosslinking agent was vinyltriethoxysilane, purchased from The Dow Chemical Company.

EXAMPLES 2-6

A dielectric elastomer precursor liquid was different from that of Example 1 in that, in Examples 2-6, the volume fractions of ionic liquid and solvent were 45%, 10%, 15%, 30% and 40%, respectively, and the rest were all the same as Example 1.

In the above, the volume fractions of the ionic liquid and the solvent in Examples 4-6 were within the preferred range of the present disclosure.

EXAMPLES 7-9

A dielectric elastomer precursor liquid was different from that of Example 6 in that, in Examples 7-9, the volume ratios of ionic liquid and solvent were 3:1, 2:1 and 1:1, respectively, and the rest were all the same as Example 6.

The volume ratios of ionic liquid and solvent in Examples 7-9 was within the preferred range of the present disclosure.

EXAMPLES 10-12

A dielectric elastomer precursor liquid was different from that of Example 9 in that, in Examples 10-12, the droplet diameters of the liquid mixture of ionic liquid and solvent were 2, 10 and 5 microns, respectively, and the rest were all the same as Example 9.

The droplet diameters of the liquid mixture of ionic liquid and solvent in Examples 10-12 were within the preferred range of the present disclosure.

EXAMPLE 13

A dielectric elastomer precursor liquid was different from that of Example 12 in that, in the present example, the elastomer matrix was polyacrylate, purchased from Shanghai Aladdin Biochemical Technology Co., Ltd.; the ionic liquid was 1-ethyl-3-methylimidazolium bis(trifluoromethylsulfonyl)imide, purchased from Lanzhou Institute of Chemical Physics, Chinese Academy of Sciences; the solvent was fluoroethylene carbonate, purchased from Shanghai Aladdin Biochemical Technology Co., Ltd.; and the crosslinking agent was 1,6-hexylene glycol diacrylate, purchased from Shanghai Aladdin Biochemical Technology Co., Ltd., and the rest were all the same as Example 12.

EXAMPLE 14

A dielectric elastomer precursor liquid was different from that of Example 12 in that, in the present example, the elastomer matrix was polydimethylsiloxane, and the ionic liquid was 1-Propyl-3-Methylimidazolium bis(trifluoromethylsulfonyl)imide and 1-ethyl-3-methylimidazolium bis(trifluoromethylsulfonyl)imide at a volume ratio of 2:1; and the solvent was tributyl citrate and fluoroethylene carbonate at a volume ratio of 1:1, the crosslinking agent was vinyltriethoxysilane, and the rest were all the same as Example 12.

The preparation method of the dielectric elastomer precursor liquid in each of the above-mentioned examples includes mixing the raw materials uniformly to obtain the precursor liquid.

TEST EXAMPLES 1-14

After the above dielectric elastomer precursor liquids were cured respectively, a dielectric elastomer composite material was obtained, wherein the curing was thermal curing, the curing temperature was 70° C., and the curing time was 10 h.

TEST EXAMPLES 15-28

In a light-emitting device, wherein each of the above dielectric elastomer precursor liquids and a light-emitting material ZnS:Cu with a particle diameter of 15-30 microns (the mass ratio of the dielectric elastomer precursor liquid and the light-emitting material was 3:1) were respectively mixed uniformly to obtain the light-emitting layer precursor liquid, the thickness of the light-emitting layer precursor liquid was controlled to be 200 microns, and then it was cured to obtain the light-emitting layer, wherein the curing was thermal curing, the curing temperature is 70° C., and the curing time is 10 h. Finally, ITO transparent flexible electrodes were respectively pasted on both sides of the light-emitting layer to obtain the light-emitting device. The light-emitting material ZnS:Cu was purchased from Shanghai Keyan Optoelectronics Technology Co., Ltd.

TEST EXAMPLES 29-31

A light-emitting device was different from that in Test Example 28 in that, in Test Examples 29-31, the mass ratios of the dielectric elastomer precursor liquid and the light-emitting material were 0.5:1, 0.8:1 and 1:1, respectively, and the rest were all the same as Test Example 28.

The mass ratio of the dielectric elastomer precursor liquid and the light-emitting material in Test Examples 29-31 was within the preferred range of the present disclosure.

COMPARATIVE EXAMPLE 1

A dielectric elastomer precursor liquid was mainly prepared from an elastomer matrix, an ionic liquid and a crosslinking agent, wherein the volume fraction of the ionic liquid was 5%, and the droplet diameter of the ionic liquid was 11 microns; and
the elastomer matrix was polydimethylsiloxane, the ionic liquid was 1-Propyl-3-Methylimidazolium bis(trifluoromethylsulfonyl)imide, and the crosslinking agent was vinyltriethoxysilane.

The difference from Example 1 was that the present Comparative Example contains no solvent.

COMPARATIVE EXAMPLE 2

A dielectric elastomer precursor liquid was mainly prepared from an elastomer matrix, a solvent and a crosslinking agent, wherein the volume fraction of the solvent was 5%, and the droplet diameter of the solvent was 11 microns; and
the elastomer matrix was polydimethylsiloxane, the solvent was tributyl citrate, and the crosslinking agent was vinyltriethoxysilane.

The difference from Example 1 was that the present Comparative Example did not contain ionic liquid.

COMPARATIVE EXAMPLES 3-4

A dielectric elastomer precursor liquid was different from that of Example 1 in that, in Comparative Examples 3-4, the volume fractions of the sum of the ionic liquid and the solvent were 4% and 48%, respectively, and the rest were all the same as Example 1.

The volume fractions of ionic liquid and solvent in Comparative Examples 3-4 were not within the range provided in the present disclosure.

COMPARATIVE TEST EXAMPLES 1-4

After the dielectric elastomer precursor liquids in the above Comparative Examples were respectively cured, a dielectric elastomer composite material was obtained, wherein the curing was thermal curing, the curing temperature was 70° C., and the curing time was 10 h.

COMPARATIVE TEST EXAMPLES 5-8

In a light-emitting device, wherein the dielectric elastomer precursor liquid in each of the above Comparative Examples and a light-emitting material ZnS:Cu with a particle diameter of 15-30 microns (the mass ratio of the dielectric elastomer precursor liquid and the light-emitting material was 3:1) were respectively mixed uniformly to obtain the light-emitting layer precursor liquid, the thickness of the light-emitting layer precursor liquid was controlled to be 200 microns, and then it was cured to obtain the light-emitting layer, wherein the curing was thermal curing, the curing temperature is 70° C., and the curing time is 10 h. Finally, ITO transparent flexible electrodes were respectively pasted on both sides of the light-emitting layer to obtain the light-emitting device.

Effect Test

The dielectric constant, elastic modulus and light transmittance of the dielectric elastomer composite materials in each of the above test examples and each of the above comparative test examples were respectively tested. The dielectric constant was measured by using a broadband dielectric impedance spectrometer, model concept 40, from Novacontrol Company, Germany, according to the manufacturer's instructions. The elastic modulus was measured by using an electronic universal testing machine, model UTM6104, from Shenzhen Sansi Zongheng Technology Co., Ltd., according to the manufacturer's instructions. Light transmittance was measured by using a UV-3600Plus model UV-spectrophotometer from Shimadzu Corporation, Japan, according to the manufacturer's instructions. The results are shown in Table 1. The driving voltage and luminous intensity under the electric field intensity of 2V/μm of the light-emitting devices in each of the test examples and each of the comparative test examples were tested respectively, the driving voltage was measured by using a digital oscilloscope, model DSOX1204A, from Keysight Technologies Company, USA, according to the manufacturer's instructions. Luminous intensity was measured by using a luminance meter, model TES-137, from Taiwan TES Electrical Electronic Corp., according to the manufacturer's instructions. The results are shown in Table 2.

TABLE 1

| Group | Dielectric constant | Elastic modulus (kPa) | Light transmittance (%) |
|---|---|---|---|
| Test Example 1 | 3.73 | 949 | 93.84 |
| Test Example 2 | 17.33 | 565 | 85.30 |
| Test Example 3 | 4.28 | 898 | 93.52 |
| Test Example 4 | 5.04 | 855 | 92.90 |
| Test Example 5 | 9.37 | 749 | 90.82 |
| Test Example 6 | 14.48 | 669 | 87.89 |
| Test Example 7 | 15.11 | 581 | 90.13 |
| Test Example 8 | 15.86 | 537 | 90.54 |
| Test Example 9 | 16.98 | 488 | 90.87 |
| Test Example 10 | 18.65 | 430 | 92.10 |
| Test Example 11 | 17.51 | 452 | 91.05 |
| Test Example 12 | 19.20 | 439 | 91.92 |
| Test Example 13 | 15.72 | 362 | 92.40 |
| Test Example 14 | 16.45 | 525 | 90.10 |
| Comparative Test Example 1 | 3.53 | 989 | 93.15 |
| Comparative Test Example 2 | 2.85 | 893 | 93.34 |
| Comparative Test Example 3 | 3.01 | 968 | 94.10 |
| Comparative Test Example 4 | breakover | 412 | 79.25 |

As can be seen from Table 1, the comprehensive performance of the dielectric constant, elastic modulus and light transmittance in each test example is better than that of each comparative test example, which indicates that the dielectric elastomer precursor liquids provided by the present disclosure are scientific and reasonable, and the obtained dielectric elastomer composite materials have a higher dielectric constant, a lower elastic modulus and a higher light transmittance, and are a type of composite material with a good application prospect, which are suitable for various flexible devices.

Further analysis shows that the comprehensive performance of Test Examples 4-6 is better than that of Test Examples 1-3, which indicates that when the volume fraction of ionic liquid and solvent is within the preferred range of the present disclosure, the performance of the composite material is better; the comprehensive performance of Test Examples 7-9 is better than that of Test Example 6, which indicates that further optimizing the volume ratio of ionic liquid and solvent is conducive to further improving the performance of the composite material; and the comprehensive performance of Test Examples 10-12 is better than that of Test Example 9, which indicates that further optimizing the droplet diameter of the liquid mixture of ionic liquid and solvent is beneficial to further improve the performance of the composite material.

TABLE 2

| Group | driving voltage (V) | luminous intensity under the electric field intensity of 2 V/μm (cd/m$^2$) |
|---|---|---|
| Test Example 15 | 398 | 1.03 |
| Test Example 16 | 205 | 14.52 |
| Test Example 17 | 392 | 1.50 |
| Test Example 18 | 388 | 2.38 |
| Test Example 19 | 346 | 3.30 |
| Test Example 20 | 256 | 8.13 |
| Test Example 21 | 244 | 9.94 |
| Test Example 22 | 230 | 11.72 |
| Test Example 23 | 215 | 14.18 |
| Test Example 24 | 179 | 23.80 |
| Test Example 25 | 194 | 19.20 |
| Test Example 26 | 148 | 41.02 |
| Test Example 27 | 232 | 10.85 |
| Test Example 28 | 219 | 13.20 |
| Test Example 29 | 120 | 101.28 |
| Test Example 30 | 149 | 64.20 |
| Test Example 31 | 160 | 43.34 |
| Comparative Test Example 5 | 402 | non-luminance |
| Comparative Test Example 6 | 410 | non-luminance |
| Comparative Test Example 7 | 408 | non-luminance |
| Comparative Test Example 8 | breakover | non-luminance |

Note:
the above driving voltage refers to the peak value ($V_{p\text{-}p}$) of the corresponding AC voltage peak when the luminous intensity of the device reaches 1 cd/m$^2$.

It can be seen from Table 2 that the comprehensive performance of driving voltage and luminous intensity of each test example is better than that of each comparative test example, which indicates that the dielectric elastomer precursor liquids provided by the present disclosure are scientific and reasonable, and the obtained light-emitting devices have a lower driving voltage and a higher luminous intensity.

Further analysis shows that the comprehensive performance of Test Examples 18-20 is better than that of Test Examples 15-17, which indicates that when the volume fraction of ionic liquid and solvent is within the preferred range of the present disclosure, the performance of the light-emitting device is better; the comprehensive performance of Test Examples 21-23 is better than that of Test Example 20, which indicates that further optimization of the volume ratio of ionic liquid and solvent is conducive to further improving the performance of the light-emitting device; the comprehensive performance of Test Examples 24-26 is better than that of Test Example 23, which indicates that further optimizing the droplet diameter of the liquid mixture of ionic liquid and solvent is beneficial to further improve the performance of the light-emitting device; and the comprehensive performance of Test Examples 29-31 is better than that of Test Example 28, which indicates that further optimizing the mass ratio of the dielectric elastomer precursor liquid to the light-emitting material is beneficial to further improve the performance of the light-emitting device.

While specific embodiments of the present disclosure have been illustrated and described, it should be understood that various other changes and modifications can be made without departing from the spirit and scope of the present disclosure. Therefore, it means that all such changes and modifications falling within the scope of the present disclosure are included in the appended claims.

INDUSTRIAL APPLICABILITY

The dielectric elastomer precursor liquid of the present disclosure is beneficial to improve the dielectric constant, elastic modulus and transparency of the composite material, thereby improving the comprehensive performance of the composite material. In the light-emitting device provided by the present disclosure, the dielectric elastomer precursor liquid is combined with the light-emitting material. Since the dielectric elastomer precursor liquid has a higher conductivity, the dielectric constant of the light-emitting layer of the light-emitting device can be improved, so the intensity of the electric field focused on the light-emitting layer increases, and because the dielectric elastomer precursor liquid has a higher optical transparency, the light emitted by the light-emitting material will not be lost during the propagation process, therefore, the driving voltage of the obtained light-emitting device is lower. In addition, since the above-mentioned dielectric elastomer precursor liquid has a good fluidity, the obtained light-emitting device has a low elastic modulus and a good stretchability.

What is claimed is:

1. A dielectric elastomer precursor fluid, comprising an elastomer matrix, an ionic liquid and a solvent, wherein a volume fraction of the ionic liquid and the solvent is 5%-45%;
the elastomer matrix comprises polydimethylsiloxane;
the dielectric elastomer precursor liquid further comprises a crosslinking agent;
a volume ratio of the ionic liquid to the solvent is (9-1):1; and
a droplet diameter of a liquid mixture of the ionic liquid and the solvent is 2-10 microns.

2. The dielectric elastomer precursor fluid according to claim 1, wherein the volume fraction of the ionic liquid and the solvent is 10%-40%.

3. The dielectric elastomer precursor fluid according to claim 2, wherein the volume fraction of the ionic liquid and the solvent is 15%-40%.

4. The dielectric elastomer precursor fluid according to claim 1, wherein the volume ratio of the ionic liquid to the solvent is (3-1):1.

5. The dielectric elastomer precursor fluid according to claim 1, wherein the droplet diameter of a liquid mixture of the ionic liquid and the solvent is 2-5 microns.

6. The dielectric elastomer precursor fluid according to claim 1, wherein the ionic liquid comprises at least one of 1-Propyl-3-Methylimidazolium bis(trifluoromethylsulfonyl)imide, 1-ethyl-3-methylimidazolium hexafluorophosphate or 1-ethyl-3-methylimidazolium bis(trifluoromethylsulfonyl)imide.

7. The dielectric elastomer precursor fluid according to claim 1, wherein the solvent comprises tributyl citrate and/or fluoroethylene carbonate.

8. The dielectric elastomer precursor fluid according to claim 1, wherein a difference value between a refractive index of the elastomer matrix and a refractive index of the liquid mixture of the ionic liquid and the solvent is 0-0.001.

9. The dielectric elastomer precursor fluid according to claim 8, wherein the refractive index of the elastomer matrix is the same as the refractive index of the liquid mixture of the ionic liquid and the solvent.

10. A dielectric elastomer composite material, wherein the dielectric elastomer composite material is prepared from the dielectric elastomer precursor liquid according to claim 1.

11. A light-emitting device, wherein the light-emitting device is mainly prepared from the dielectric elastomer precursor liquid according to claim 1, a light-emitting material and an electrode.

12. The light-emitting device according to claim 11, wherein a mass ratio of the dielectric elastomer precursor liquid and the light-emitting material is (0.4-2):1.

13. The light-emitting device according to claim 12, wherein a mass ratio of the dielectric elastomer precursor liquid and the light-emitting material is (0.5-1):1.

14. The light-emitting device according to claim 11, wherein a particle diameter of the light-emitting material is larger than a diameter of a droplet of the ionic liquid.

15. The light-emitting device according to claim 14, wherein the particle diameter of the light-emitting material is 9-30 microns.

* * * * *